United States Patent
Shang et al.

(10) Patent No.: US 7,160,392 B2
(45) Date of Patent: Jan. 9, 2007

(54) METHOD FOR DECHUCKING A SUBSTRATE

(75) Inventors: Quanyuan Shang, Saratoga, CA (US); William R. Harshbarger, San Jose, CA (US); Robert L. Greene, Fremont, CA (US); Ichiro Shimizu, Itami (JP)

(73) Assignee: Applied Materials, Inc., Santa Clara, CA (US)

( * ) Notice: Subject to any disclaimer, the term of this patent is extended or adjusted under 35 U.S.C. 154(b) by 164 days.

(21) Appl. No.: 10/688,384

(22) Filed: Oct. 17, 2003

(65) Prior Publication Data

US 2004/0089239 A1 May 13, 2004

Related U.S. Application Data

(60) Division of application No. 10/308,385, filed on Dec. 2, 2002, now Pat. No. 6,676,761, which is a continuation of application No. 09/619,870, filed on Jul. 20, 2000, now abandoned.

(51) Int. Cl.
*H01L 21/027* (2006.01)
*C23C 16/00* (2006.01)

(52) U.S. Cl. .................. 118/728; 118/500; 156/345.23

(58) Field of Classification Search .............. 269/13, 269/54.2–54.5; 118/500, 728
See application file for complete search history.

(56) References Cited

U.S. PATENT DOCUMENTS

| | | | |
|---|---|---|---|
| 4,556,362 A * | 12/1985 | Bahnck et al. ............ 414/744.3 |
| 4,944,650 A | 7/1990 | Matsumoto | |
| 5,098,501 A * | 3/1992 | Nishiguchi ............... 156/275.5 |
| 5,352,294 A | 10/1994 | White et al. | |
| 5,380,566 A | 1/1995 | Robertson et al. | |
| 5,518,593 A | 5/1996 | Hosokawa et al. | |
| 5,582,866 A | 12/1996 | White | |
| 5,677,824 A | 10/1997 | Harashima et al. | |
| 5,788,778 A | 8/1998 | Shang et al. | |
| 5,823,736 A | 10/1998 | Matsumura | |

(Continued)

FOREIGN PATENT DOCUMENTS

EP 0 798 775 A2 10/1997

(Continued)

OTHER PUBLICATIONS

The definitions of "project" and "acutate" according to answers. com.*

(Continued)

*Primary Examiner*—Parviz Hassanzadeh
*Assistant Examiner*—Sylvia R. MacArthur
(74) *Attorney, Agent, or Firm*—Patterson & Sheridan LLP (57) ABSTRACT

A substrate support assembly and method for dechucking a substrate is provided. In one embodiment, a support assembly includes a substrate support having a support surface, a first set of lift pins and one or more other lift pins movably disposed through the substrate support. The first set of lift pins and the one or more lift pins project from the support surface when the pins are in an actuated position. When in the actuated position, the first set of lift pins project a longer distance from the support surface than the one or more other lift pins. In another aspect of the invention, a method for dechucking a substrate from a substrate support is provided. In one embodiment, the method includes the steps of projecting a first set of lift pins a first distance above a surface of a substrate support, and projecting a second set of lift pins a second distance above the surface of the substrate support that is less than the first distance.

8 Claims, 6 Drawing Sheets

U.S. PATENT DOCUMENTS

| | | |
|---|---|---|
| 5,983,906 A | 11/1999 | Zhao et al. |
| 5,997,651 A | 12/1999 | Matsuse et al. |
| 6,002,840 A | 12/1999 | Hofeister |
| 6,109,677 A | 8/2000 | Anthony |
| 6,140,256 A | 10/2000 | Ushikawa |
| 6,183,189 B1 | 2/2001 | Lzu et al. |
| 6,305,677 B1 | 10/2001 | Lenz |
| 6,676,761 B1 * | 1/2004 | Shang et al. ............... 118/728 |
| 6,887,317 B1 * | 5/2005 | Or et al. .................... 118/728 |

FOREIGN PATENT DOCUMENTS

| | | |
|---|---|---|
| JP | 2000-294482 | 10/2000 |
| WO | WO 97/20340 | 6/1997 |

OTHER PUBLICATIONS

English Translation of JP 2000-294482.*

* cited by examiner

METHOD FOR DECHUCKING A
SUBSTRATE

CROSS-REFERENCE TO RELATED APPLICATIONS

This application is a division of U.S. patent application Ser. No. 10/308,385, filed Dec. 2, 2002, now U.S. Pat. No. 6,676,761, which is a continuation of U.S. patent application Ser. No. 09/619,870, filed Jul. 20, 2000, now abandoned, which are herein incorporated by reference in their entireties.

BACKGROUND OF THE DISCLOSURE

1. Field of Invention

The invention relates generally to a method for lifting (e.g., dechucking) a substrate from a substrate support in a semiconductor processing chamber.

2. Background of the Invention

Liquid crystal displays or flat panels are commonly used for active matrix displays such as computer and television monitors. Generally, flat panels comprise two glass plates having a layer of liquid crystal material sandwiched therebetween. At least one of the glass plates includes at least one conductive film disposed thereon that is coupled to a power source. Power, supplied to the conductive film from the power supply, changes the orientation of the crystal material, creating a patterned display. One fabrication process frequently used to produce flat panels is plasma enhanced chemical vapor deposition (PECVD).

Plasma enhanced chemical vapor deposition is generally employed to deposit thin films on a substrate such as a flat panel or semiconductor wafer. Plasma enhanced chemical vapor deposition is generally accomplished by introducing a precursor gas into a vacuum chamber that contains a substrate. The precursor gas is typically directed through a distribution plate situated near the top of the chamber. The precursor gas in the chamber is energized (e.g., excited) into a plasma by applying RF power to the chamber from one or more RF sources coupled to the chamber. The excited gas reacts to form a layer of material on a surface of the substrate that is positioned on a heated substrate support. A shadow frame and optionally a purge gas is routed through holes in the support to the edge of the substrate to prevent deposition at the substrate's edge that may cause the substrate to adhere to the support. Volatile by-products produced during the reaction are pumped from the chamber through an exhaust system.

After the deposition process, the substrate is lifted (e.g., dechucked) from the substrate support by a plurality of lift pins disposed through the substrate support. The lift pins are actuated upwards to contact the backside of the substrate and raise the substrate above the substrate support's upper surface. From this position, a substrate transfer mechanism, typically a blade coupled to a robot, may be positioned between the substrate and the substrate support. The lift pins are retracted, leaving the substrate on the transfer mechanism that is now free to remove the substrate from the processing chamber.

During the deposition process, the substrate may become residually attracted to the substrate support. For example during plasma processing, charge generally accumulates on the substrate due to the difference in mobility between ions and electrons within the plasma. Typically, the more active and mobile electrons reach the substrate in greater numbers than the ions, resulting in a net charge accumulation. The accumulated electrons on the substrate's surface facing the plasma results in a corresponding accumulation of positive charge on the substrate's backside, creating a static attraction between the substrate and the substrate support.

As the lift pins begin to lift the substrate from the substrate support, the center region of the substrate (i.e., the region between the lift pins) remains attracted to the substrate support, causing the substrate to bow. As the lift pins continue to move farther away from the substrate support, the force separating the substrate from the substrate support overcomes the static attraction allowing the substrate to regain a substantially planar or slightly bowed form as the substrate is supported by the lift pins in a spaced-apart relation to the substrate support.

However, if the static attraction is great enough during the dechucking process, the substrate bows excessively before the substrate becomes completely separated from the substrate support. The excessive bowing of the substrate may result in cracking, breakage or other damage to the substrate and/or material layers or devices disposed on the substrate. Additionally, excessive bowing of the substrate may cause the lift pins to slide slightly on the backside of the substrate, scratching the substrate and increasing the probability of particulate generation that may contaminate the substrate or other substrates subsequently processed in the chamber.

The static attraction may be dissipated by introducing plasma formed from an inactive gas in the chamber during the dechucking process. The plasma redistributes the charges across the substrate, minimizing the static attraction between the substrate and the substrate support. This process for reducing the static attraction was disclosed in U.S. Pat. No. 5,380,566, issued Jun. 10, 1995, by Robertson et al. Although as little as two seconds of exposure to the plasma formed from the inactive gas may be enough to dissipate static attraction forces and allow the substrate to be dechucked without damage, it is desirable to process the substrate with as few steps as possible and to minimize the consumables such as gases used during processing.

Therefore, there is a need for dechucking a substrate from a substrate support that prevents excessive bowing of the substrate during dechucking.

SUMMARY OF INVENTION

In one aspect of the invention, a method for dechucking a substrate from a substrate support is provided. In one embodiment, the method includes the steps of projecting a first set of lift pins a first distance above a surface of a substrate support to lift a substrate, and projecting a second set of lift pins a second distance above the surface of the substrate support that is less than the first distance. In another embodiment, the second set of lift pins contact the substrate if the substrate bows more than a predetermined amount.

Another aspect of the invention generally provides a substrate support assembly for supporting a substrate during processing. In one embodiment, a support assembly includes a substrate support having a support surface, a first set of lift pins and a second set of lift pins movably disposed through the substrate support. The first set of lift pins and the second set of lift pins project from the support surface when the pins are in an actuated position. When in the actuated position, the first set of lift pins project a greater distance from the support surface than the second set of lift pins. In another embodiment, a support assembly includes a lift plate that contacts the first set of lift pins before contacting the second set of lift pins.

BRIEF DESCRIPTION OF DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAIL DESCRIPTION OF INVENTION

The invention generally provides a substrate support and method for dechucking a substrate that are advantageous for lifting a substrate from a substrate support. The invention is illustratively described below in reference to a plasma enhanced chemical vapor deposition system, such as a plasma enhanced chemical vapor deposition (PECVD) system, available from AKT, a division of Applied Materials, Inc., Santa Clara, Calif. However, it should be understood that the invention has utility in other system configurations such as physical vapor deposition systems, ion implant systems, etch systems, chemical vapor deposition systems and any other system in which lifting a substrate from a substrate support is desired.

Figure 1:
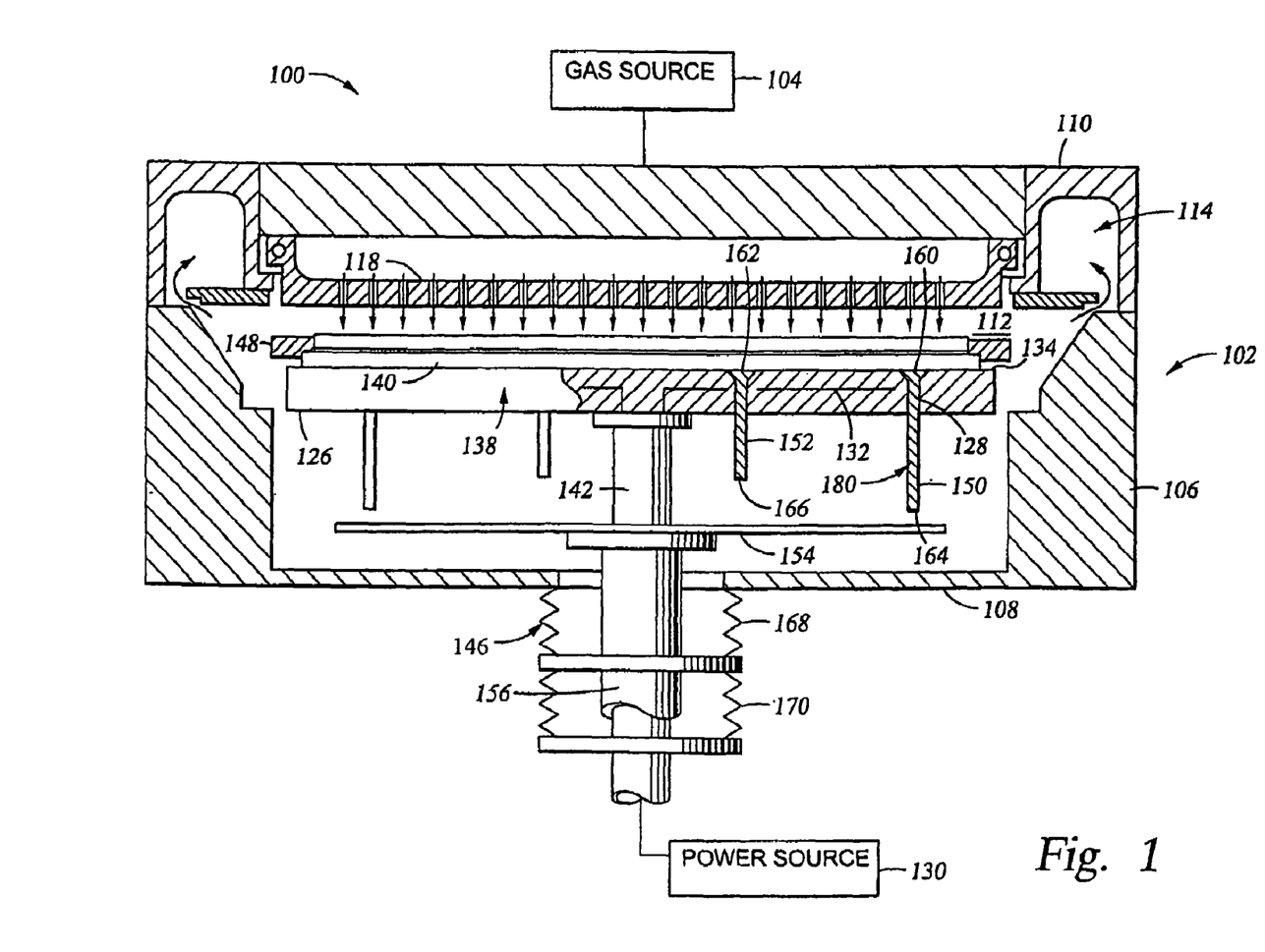
FIG. 1 depicts a schematic sectional view of one embodiment of a processing chamber of the present invention.

FIG. 1 is a cross sectional view of one embodiment of a plasma enhanced chemical vapor deposition system 100. The system 100 generally includes a chamber 102 coupled to a gas source 104. The chamber 102 has walls 106, a bottom 108 and a lid assembly 110 that define a process volume 112. The process volume 112 is typically accessed through a port (not shown) in the walls 106 that facilitates movement of the substrate 140 into and out of the chamber 102. The walls 106 and bottom 108 are typically fabricated from a unitary block of aluminum. The lid assembly 110 contains a pumping plenum 114 that couples the process volume 112 to an exhaust port (that includes various pumping components, not shown).

The lid assembly 110 is supported by the walls 106 and can be removed to service the chamber 102. The lid assembly 110 is generally comprised of aluminum and may additionally contain heat transfer fluid channels for regulating the temperature of the lid assembly 110 by flowing heat transfer fluid therethrough.

A distribution plate 118 is coupled to an interior side 120 of the lid assembly 110. The distribution plate 118 is typically fabricated from aluminum. The distribution plate generally includes a perimeter mounting ring that surrounds a "dish-shaped" center section. The mounting ring includes a plurality of mounting holes passing therethrough, each accepting a vented mounting screw that threads into a mating hole in the lid assembly 110. The center section includes a perforated area through which process and other gases supplied from the gas source 104 are delivered to the process volume 112. The perforated area of the distribution plate 118 is configured to provide uniform distribution of gases passing through the distribution plate 118 into the chamber 102.

A heated support assembly 138 is centrally disposed within the chamber 102. The support assembly 138 supports a substrate 140 during processing. The support assembly 138 generally is fabricated from aluminum, ceramic or a combination of aluminum and ceramic and typically includes a vacuum port (not shown) and at least one embedded heating element 132. The vacuum port is used to apply a vacuum between the substrate 140 and support assembly 138, securing the substrate to the substrate support assembly 138 during processing. The heating element 132, such as an electrode disposed in the support assembly 138, is coupled to a power source 130, heating the support assembly 138 and substrate 140 positioned thereon to a predetermined temperature. In one embodiment, the heating element 132 maintains the substrate 140 at a uniform temperature of about 150 to 400 degrees. Alternatively, heating lamps or other heat sources may be utilized to heat the substrate.

Generally, the support assembly 138 is coupled to a stem 142. The stem 142 provides a conduit for electrical leads, vacuum and gas supply lines between the support assembly 138 and other components of the system 100. The stem 142 couples the support assembly 138 to a lift system (not shown) that moves the support assembly 138 between an elevated position (as shown) and a lowered position. Bellows 146 provides a vacuum seal between the chamber volume 112 and the atmosphere outside the chamber 102 while facilitating the movement of the support assembly 138.

The support assembly 138 generally is grounded such that RF power supplied by a power source 122 to the distribution plate 118 (or other electrode positioned within or near the lid assembly of the chamber) may excite the gases disposed in the process volume 122 between the support assembly 138 and the distribution plate 118. The RF power, generally having a frequency of between a few Hz to 13 MHz or higher is provided in a wattage suitable for the substrate surface area. In one embodiment, the power source 122 comprises a dual frequency source that provides a low frequency power at less than about 2 MHz (preferably about 200 to 500 kHz) and a high frequency power at greater than 13 MHz (preferably about 13.56 kHz). The frequencies may be fixed or variable. Illustratively, for a 550 mm×650 mm substrate, the low frequency power is about 0.3 to about 2 kW while the high frequency power is about 1 to 5 kW. Generally, the power requirements decrease or increase with a corresponding decrease or increase in substrate size.

The support assembly 138 additionally supports a circumscribing shadow frame 148. The shadow frame 148 is configured to cover the edge of the substrate 140 and is typically comprised of ceramic. Generally, the shadow frame 148 prevents deposition at the edge of the substrate 140 and support assembly 138 so that the substrate does not stick to the support assembly 138. Optionally, a purge gas is supplied between the shadow frame 148 and the support assembly 138 to assist in preventing deposition at the substrate's edge.

The support assembly 138 has a plurality of holes 128 disposed therethrough to accept a plurality of lift pins 150 comprising a first set 180 and one or more other lift pins 152 that comprises a second set 182. The second set 182 of lift pins 152 are positioned radially inwards the first set 180 of lift pins 150. The lift pins 150 and 152 are typically comprised of ceramic or anodized aluminum. Generally, the lift pins 150 and 152 have respective first ends 160 and 162 that are substantially flush with or slightly recessed from a support surface 134 of the support assembly 138 when the lift pins 150 and 152 are in a normal position (i.e., retracted relative to the support assembly 138). The first ends 160, 162 are generally flared to prevent the lift pins 150, 152 from falling through the holes 128. Additionally, the lift pins 150 and 152 have a respective second end 164 and 166 extending beyond an underside 126 of the support assembly 138.

The lift pins 150 and 152 may move to a position when actuated where the pins project from the support surface 134. In the actuated position, the lift pins 150 project farther from the support surface 134 than the one or more lift pin 152. Typically, the first set 180 of lift pins 150 includes three or more lift pins that are positioned outwards of the one or more lift pins 152. In one embodiment, the first set 180 of lift pins 150 include eight pins grouped in pairs wherein a respective pair is positioned proximate each side of a four-sided substrate. In another embodiment, the second set 182 of lift pins 152 include two lift pins positioned to either side of a center of the support assembly 138.

A lift plate 154 is disposed proximate the underside 126 of the support surface. The lift plate 154 is disposed below the second ends 164 and 166 of one or more of the lift pins 150 and 152, respectively. The lift plate 154 is coupled to an actuator such as a pneumatic cylinder, hydraulic cylinder, lead screw, solenoid, stepper motor or other motion device (not shown) that is typically positioned outside of the process volume 112. The lift plate 154 is connected to the actuator by a collar 156 that circumscribes a portion of the stem 142. The bellows 146 includes an upper portion 168 and a lower portion 170 allow the stem 142 and collar 156 to move independently while maintaining the isolation of the process volume 112 from the environment exterior to the chamber 102. Alternatively, the motions of the lift plate 154 and support assembly 138 may be controlled via a single actuator utilizing a spring and a motion stop that controls the relative motion between the lift plate 154 or support assembly 138.

Generally, the lift plate 154 is actuated to cause the lift pins 150, 152 to extend from the support surface 134 as the support assembly 138 and the lift plate 154 move closer together relative to one another. The support assembly 138 may move closer relative to lift plate 154 either by the support assembly 138 lowering, the lift plate 154 moving upwards, the lift plate 154 lowering at a rate less than the lowering rate of the support assembly 138 or a combination thereof.

Figure 2A:
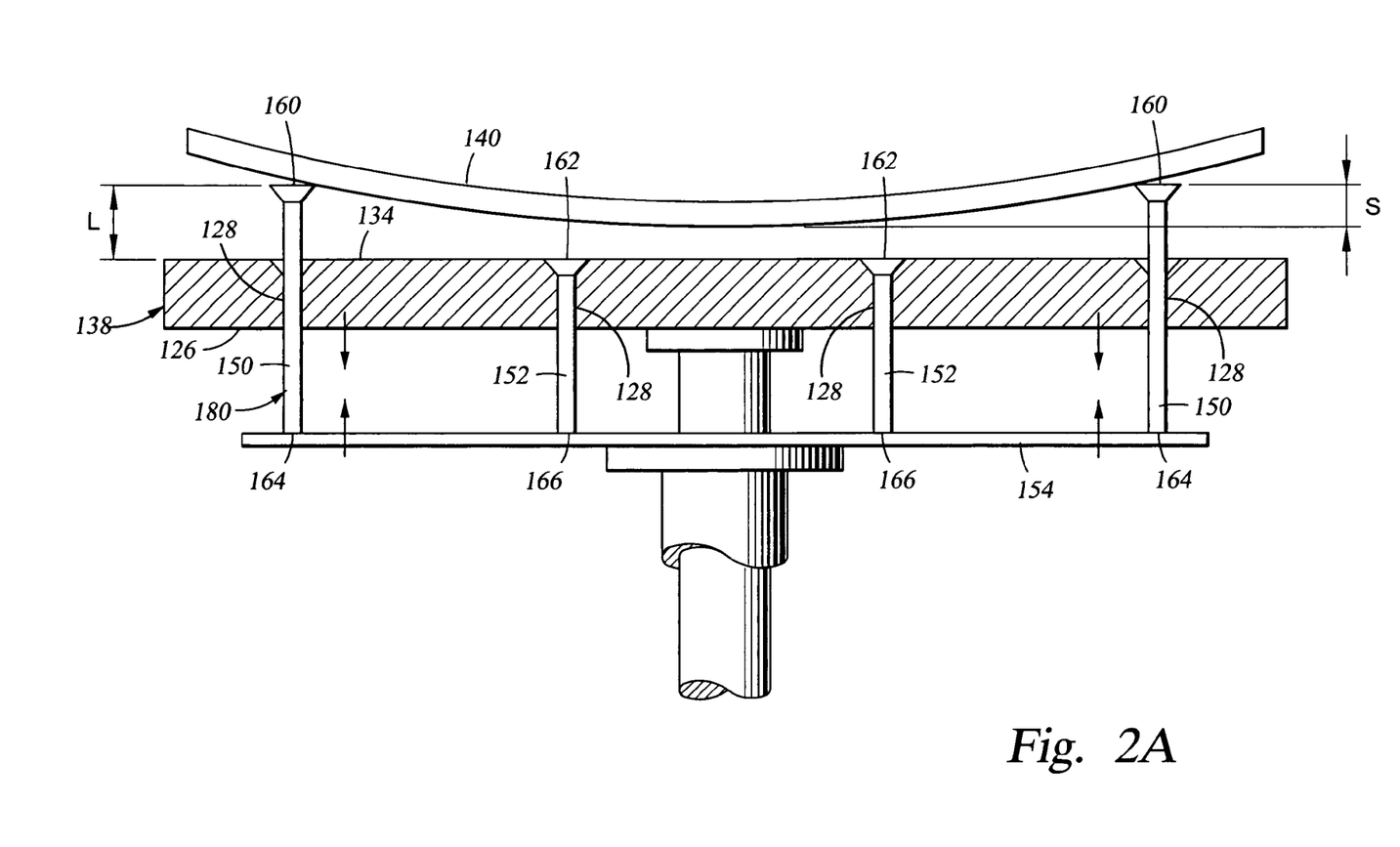
FIG. 2A is an exaggerated sectional view of one embodiment of a substrate support depicting a substrate being lifted from the support.

FIG. 2A depicts one embodiment of the substrate 140 being lifted off the support surface 134 of the support assembly 138. Generally, as the support assembly 138 moves closer relative to lift plate 154, the first set 180 of lift pins 150 that are generally longer than the second set 182 of lift pins 152 are contacted by the lift plate 154 before the second set 182 of lift pins 152. The first set 180 of lift pins 150 thus extend first the from the support surface 134 to lift the substrate 140 by its perimeter. Once the first set 180 of lift pins 150 extend a distance "L" from the support surface 134, the shorter second set 182 of lift pins 152 contact the lift plate 154. "L" may also represent the difference in length of the lift pins 150, 152. In one embodiment, "L" is at least about 2 mm.

Generally, the substrate 140 has a bow as it is lifted from the support surface 134. A portion of the bow below the plane of the lift pins 150 defines a sag "S". The position of the first set 180 of lift pins 150 relative the center of the substrate 140 is configured such that the sag "S" of the substrate is normally less than the distance "L". Attributes that effect the sag "S" include the over-all size of the substrate, the substrate's thickness, the composition of the layers present on the substrate, the distance between the lift pins 150 and the temperature of the substrate among other factors. Thus, as the substrate 140 is lifted from the support surface 134 by the first set 180 of lift pins 150, the substrate 140 is prevented from contacting the second set 182 of lift pins 152 as the substrate 140 is lifted further from the support surface 134 and the second set 182 of lift pins 152 begin to extend.

Figure 3:
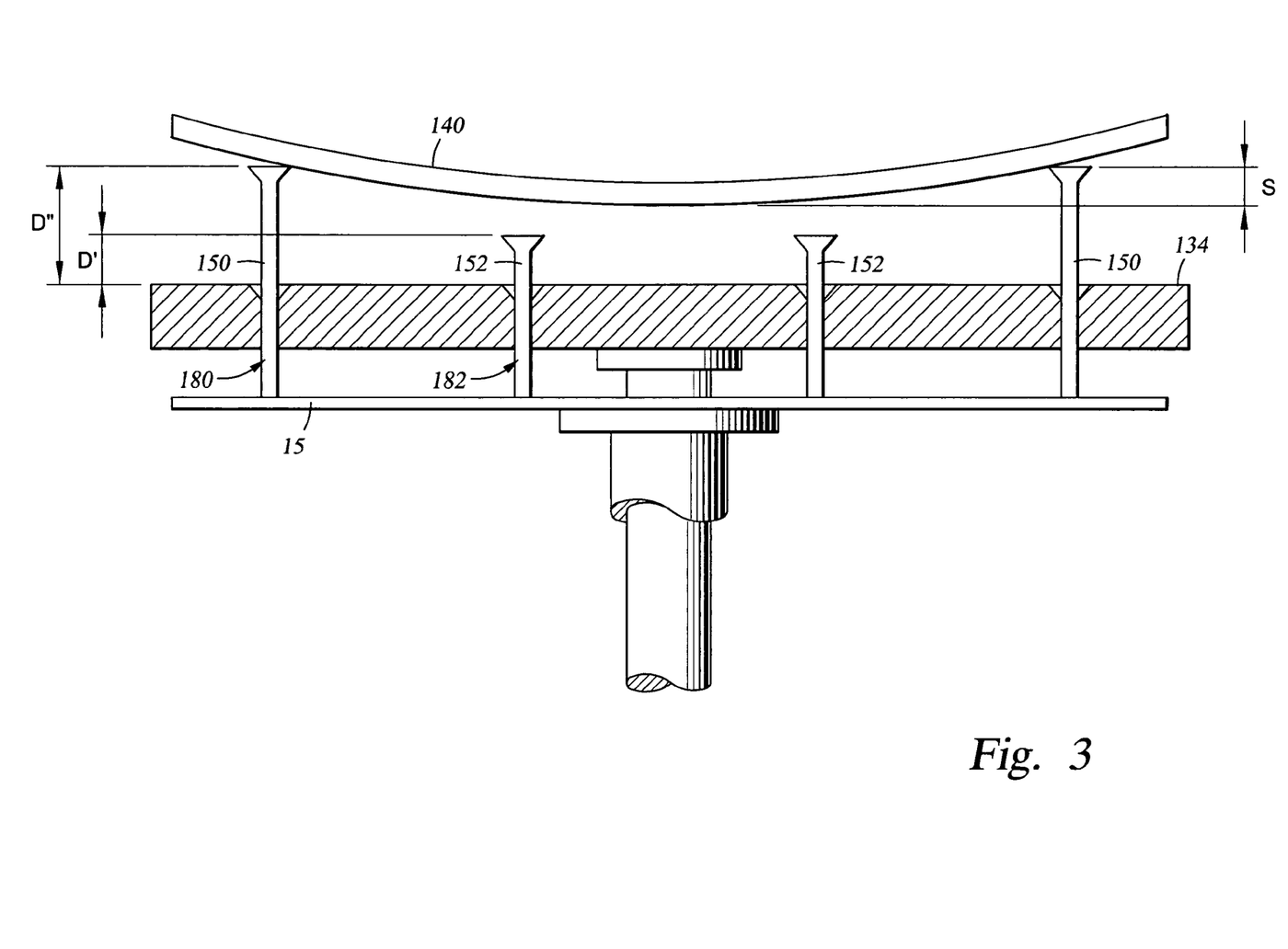
FIG. 3 is an exaggerated sectional view of one embodiment of a substrate support depicting a substrate in a lifted position above the support.

As depicted in FIG. 3, once the substrate 140 fully lifted from the support assembly 138, the second set 182 of lift pins 152 protrude a distance D' from the support surface 134 while the first set of lift pins protrude a distance D" from the support surface 134. The distance D' is less than the distance D" such that the second set 182 of lift pins 152 remain clear of the substrate 140 once the substrate is free of the support surface 134. Thus, as the substrate 140 is lifted from the support assembly 138, minimal contact is made with the lift pins (i.e., the lift pins 152 never touch the substrate 140) thus reducing the probability that the center portions of the substrate 140 may be scratched.

Figure 2B:
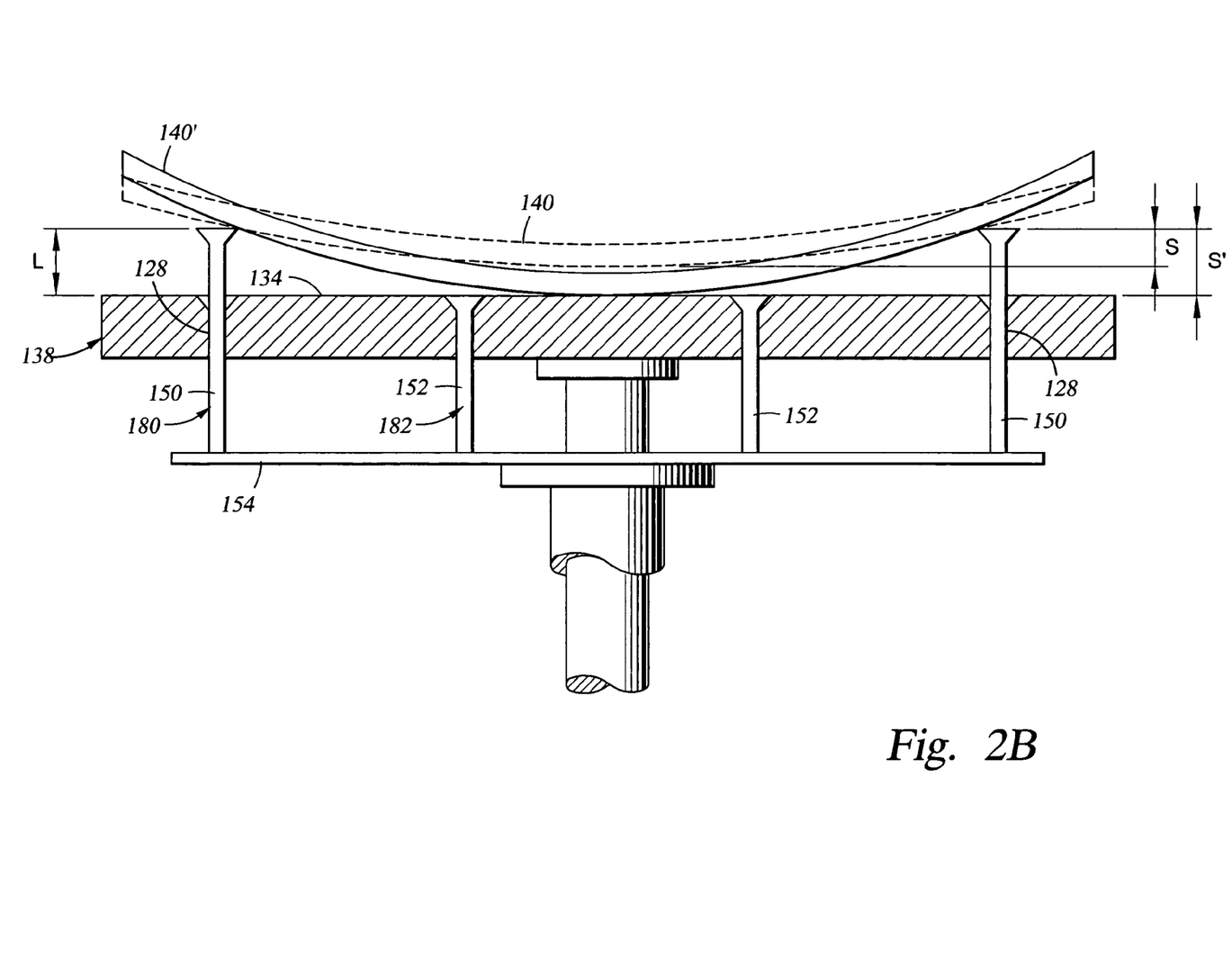
FIG. 2B is an exaggerated sectional view of one embodiment of a substrate support depicting a substrate being lifted from the support wherein the substrate is bowed beyond its normal sag.

As depicted in FIG. 2B, residual forces (such as static attraction) between a substrate 140' and support assembly 138 may cause the substrate 140' to bow beyond the predetermined amount indicated by "S" in FIG. 2A. If the residual forces are great enough, or cannot sufficiently be discharged, the sag "S'" of the substrate 140' becomes equal to the distance "L" as the substrate 140' is lifted from the support surface 134 by the first set 180 of lift pins 150. At this point the second set 182 of lift pins 152 contact the center portion of the substrate 140'. As the lift plate 118 and substrate support 138 move closer together, the second set 182 of lift pins 152 contact the substrate 140' radially inwards of the first set 180 of lift pins 150. The second set 182 of lift pins 152 lift the center portion of the substrate 140' overcoming the residual attraction therebetween that is generally concentrated at the substrate's center, thus preventing the substrate from bowing beyond the predetermined amount of sag S' that may cause damage to the substrate and/or layers or devices deposited thereon. As the substrate 140' becomes separated from the support surface 134 of the support assembly 138, the substrate 140' is no longer subject to the residual forces that created the sag "S'" and returns to its normal orientation shown in phantom in having the sag "S" wherein the substrate 140 no longer touches the second set 182 of lift pins 152. As the lift plate 254 continues to place the lift pins 150 and 152 in the fully actuated position, the substrate 140 is positioned in a space-apart relation to the support surface 134 as depicted in FIG. 3.

Figure 4:
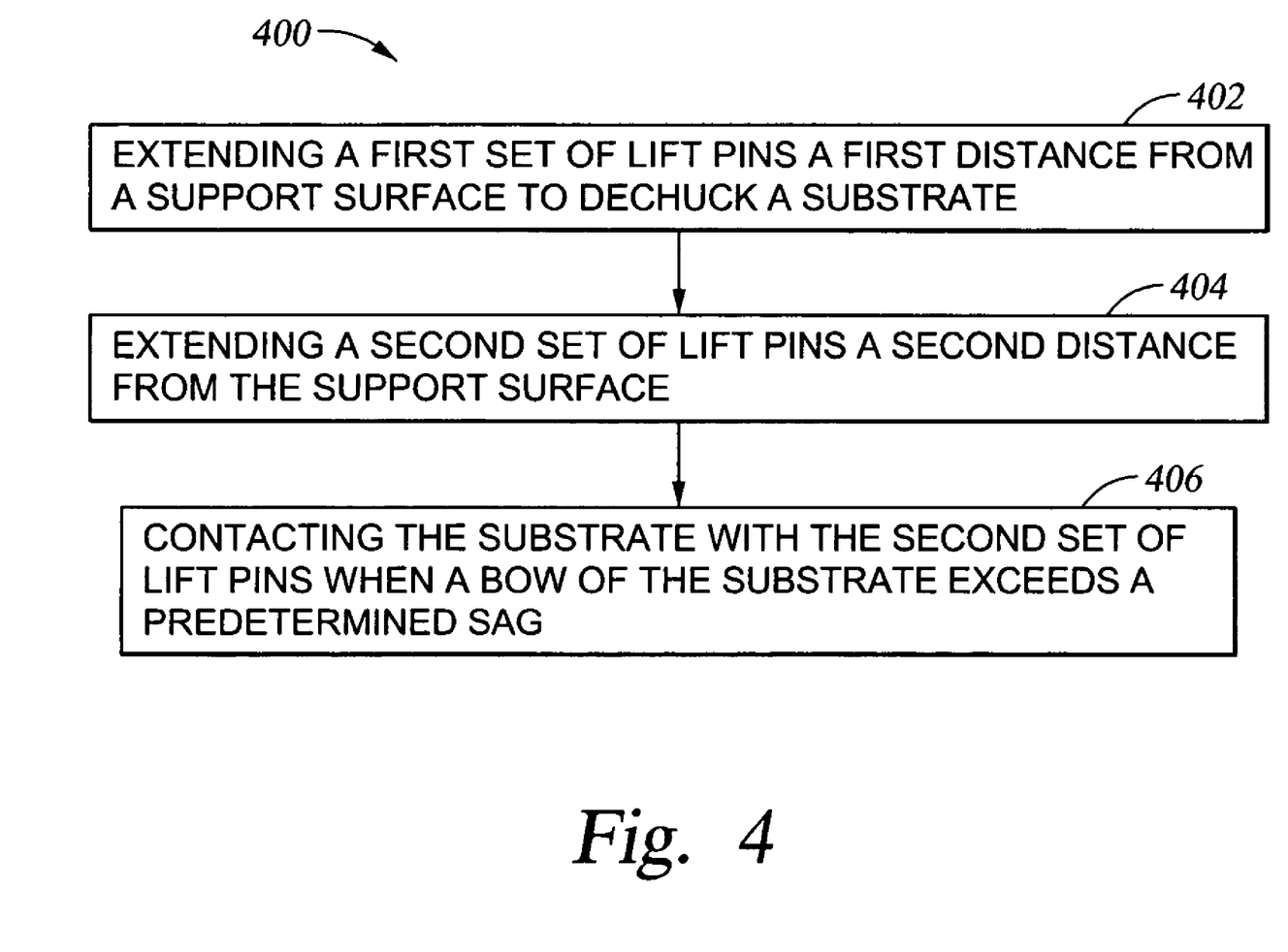
FIG. 4 is a flow diagram depicting a dechucking process.

FIG. 4 is a flow diagram of the method 400 of lifting a substrate from a support surface (e.g., dechucking) according to one embodiment of the invention. Starting at step 402 and referring to FIG. 3, a first set 180 of lift pins 150 are extended a first distance D" from a support surface 134 of a support assembly 138. At step 404, a second set 182 of lift pins 152 are extended a second distance D' from the support surface 134 of the support assembly 138. Generally, the second set 182 of lift pins 152 are located radially inwards of the first set 180 of lift pins 150. At step 406, the second set 182 of lift pins 152 contact the substrate 140 if the residual attraction between the substrate 140 and the support assembly 138 causes the substrate to have a sag "S''" (see FIG. 2B) equal to a difference between the first and second distances (D''−D'=L).

Figure 5:
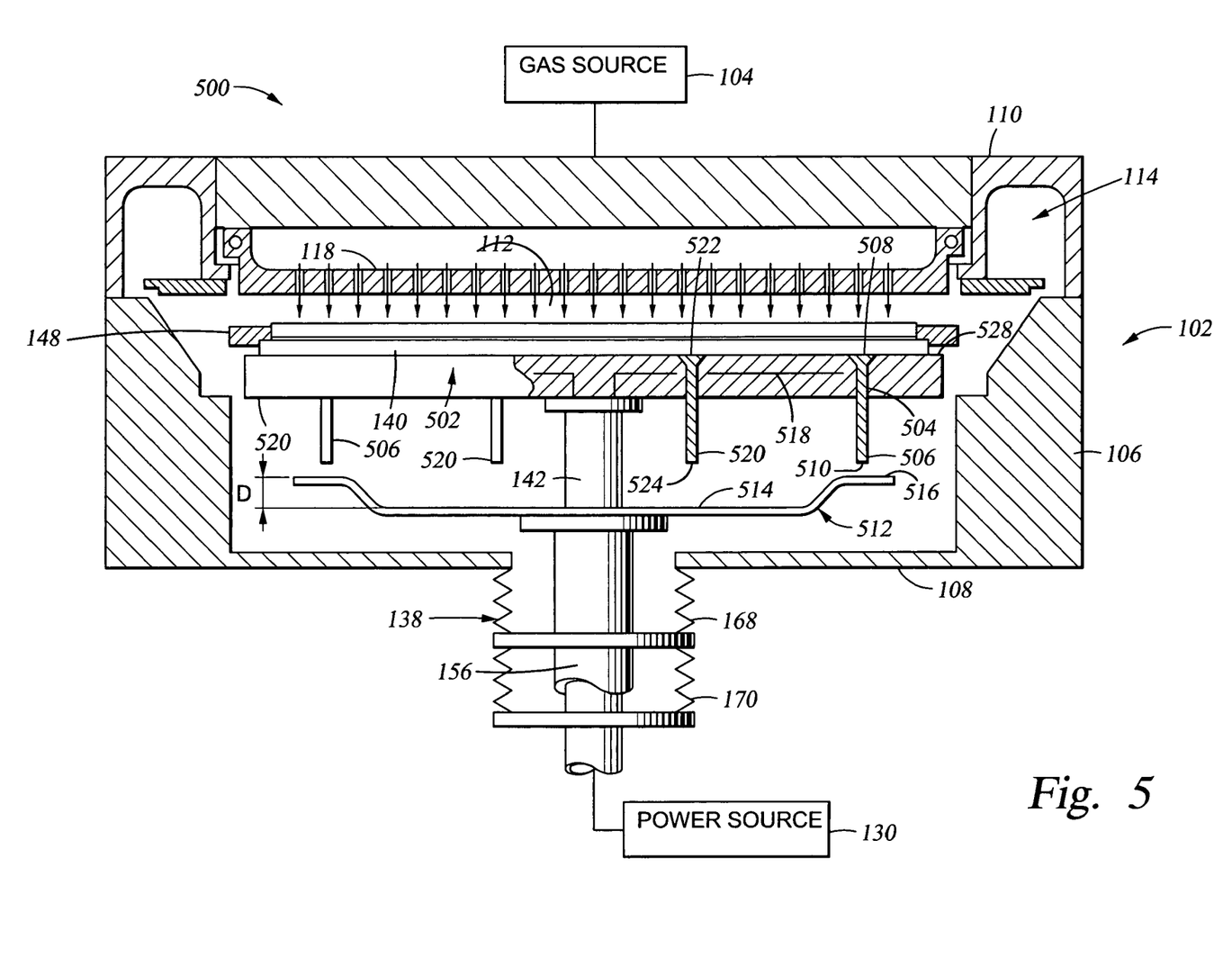
FIG. 5 is a sectional view of another embodiment of a substrate support depicting a substrate being lifted from the support.

FIG. 5 depicts another embodiment of a plasma enhanced chemical vapor deposition system 500. The system 500 generally is substantially similar to the system 100 described with reference to FIGS. 1–3 except wherein a support assembly 502 includes a first set 580 of lift pins 506 and a second set 582 of lift pins 520 that have equal length. The lift pins 506, 520 have a first flared end 508, 522, respectively, for lifting the substrate 140 from a support surface 528 of the substrate support 502. The lift pins 506, 520 have a second end 510, 524, respectively, that extend beyond an underside 530 of the substrate support 502. A lift plate 512 is disposed under the substrate support 502. The lift plate 512 generally includes a rim 516 that projects above a center portion 514.

When the lift plate 512 is actuated to elevate the substrate 140 from the support surface 528, the raised rim 516 of the lift plate 512 contacts the first set 580 of lift pins 506 before the center portion 514 contacts the second set 582 of lift pins 520. The difference in elevation "D" between the rim 516 and the center portion 514 causes the first set 580 of lift pins 506 to protrude from the support surface 528 before the second set 582 of lift pins 520. The difference in elevation "D" is selected to produce the same result as the difference in the lift pins "L". Optionally, the lift plate 512 may be used with lift pins 506, 520 of equal length.

In operation, the semiconductor substrate 140 depicted in FIG. 1 may be processed in a number of methods. For example, to deposit a silicon nitride layer, the substrate 140 is first secured to the support assembly 138 by providing a vacuum therebetween. The support assembly 138 is elevated such that the substrate 140 and distribution plate 118 are generally between about 500 to 1000 mils apart. The temperature of the substrate 140 is elevated to a predetermined process temperature between about 150 to 400 degrees Celsius primarily by providing power to the electrode 132. Gaseous components, which in one embodiment may include silane and ammonia and nitrogen, are supplied from a gas panel to the process chamber through the distribution plate 118 to form a gaseous mixture. RF power is applied between the distribution plate 118 and the support assembly 138 to form a plasma from the gaseous mixture. The gaseous mixture reacts to form a layer of silicon nitride on the substrate 140.

After processing, the substrate 140 may optionally be subjected to a plasma formed from an inactive gas (i.e., a gas that does not adversely affect the layer disposed on the substrate and does not cause additional material to be disposed on the substrate) for about 5 seconds to reduce the attraction between the substrate and the support assembly 138. Such a process is described in the previously incorporated U.S. Pat. No. 5,380,566.

The support assembly 138 is then lowered to allow removal of the processed substrate 140. The lift plate 154 is actuated to extend the lift pins 152 and substrate 140 above the support surface 134. If the residual attraction between the support surface 134 and the substrate 140 causes the substrate to sag a predetermined amount, the second set 182 of lift pins 152 contacts the substrate 140 to free the substrate 140 from the support surface 134. Once freed from the support surface 134, the substrate 140 rest on the first set 180 of lift pins 150 in a position where a substrate handling robot may enter the chamber 102 and retrieve the substrate 140 for further processing in other equipment.

If the residual attraction between the support surface 134 and the substrate 140 is not enough to cause the substrate to sag equal to the distance "L", the second set 182 of lift pins 152 never contact the substrate 140 and thus cannot leave a mark thereon.

Although the teachings of the present invention that have been shown and described in detail in a plasma enhanced chemical vapor deposition chamber, those skilled in the art can readily devise other varied embodiments in other processing chambers that incorporate the use of lift pins to separate a substrate from a support surface that still incorporate the teachings and do not depart from the scope and spirit of the invention.

What is claimed is:

1. A method for dechucking a substrate comprising:
   projecting a first set of lift pins to lift a perimeter of the substrate a first distance above a surface of a substrate support; then
   projecting a second set of lift pins to lift a center portion of the substrate, the second set of lift pins positioned radially inwards of the first set of lift pins; and then
   projecting the first set of lift pins to lift the substrate to a transfer position.

2. The method of claim 1, wherein the first set of lift pins and the second set of lift pins have projected distances that are at least 2 mm apart.

3. The method of claim 1, wherein projecting the first set of lift pins initially lifts at least a portion of the substrate to a spaced-apart relation to the substrate support and causes the substrate to bow in a central region thereof.

4. The method of claim 3, wherein projecting the second set of lift pins initially contacts the bowed region of the substrate, putting the entire substrate in a spaced-apart relation to the substrate support.

5. A method for dechucking a substrate, comprising:
   contacting a plurality of a first set of lift pins by a surface prior to contacting a second set of lift pins by the surface to lift a perimeter of the substrate with the first set of lift pins and a center portion of the substrate with the second set of lift pins;
   projecting the first set of lift pins a first distance above a surface of a substrate support; and then
   projecting the second set of lift pins a second distance less than the first distance above the surface of the substrate support.

6. The method of claim 5, wherein the surface includes a center portion and a rim that projects from the center portion.

7. The method of claim 5, wherein the first set of lift pins have a first length and the second set of the lift pins have a second length which is less than the first length.

8. The method of claim 5, wherein projecting the first set of lift pins causes the substrate to form a bowed region between the first set of lift pins and the second set of lift pins contacts the substrate in the bowed region.

* * * * *